(12) United States Patent
Smith

(10) Patent No.: US 10,935,501 B2
(45) Date of Patent: Mar. 2, 2021

(54) SUB-RESOLUTION DEFECT DETECTION

(71) Applicant: ONTO INNOVATION INC., Wilmington, MA (US)

(72) Inventor: Nigel P. Smith, Beaverton, OR (US)

(73) Assignee: Onto Innovation Inc., Wilmington, MA (US)

(*) Notice: Subject to any disclaimer, the term of this patent is extended or adjusted under 35 U.S.C. 154(b) by 15 days.

(21) Appl. No.: 16/197,737

(22) Filed: Nov. 21, 2018

(65) Prior Publication Data

US 2019/0170655 A1 Jun. 6, 2019

Related U.S. Application Data

(60) Provisional application No. 62/738,765, filed on Sep. 28, 2018, provisional application No. 62/593,777, filed on Dec. 1, 2017.

(51) Int. Cl.
*G01N 21/88* (2006.01)
*G01B 9/02* (2006.01)
(Continued)

(52) U.S. Cl.
CPC ..... *G01N 21/8806* (2013.01); *G01B 9/02081* (2013.01); *G01B 9/02083* (2013.01);
(Continued)

(58) Field of Classification Search
CPC ....... G01N 21/8806; G01N 2021/8848; G01N 2201/0683; G01N 21/9505; G01N 21/956; G01N 21/95607; G01N 21/94; G01N 21/21; G01N 21/9501; G01B 9/02081; G01B 9/02083; G01B 2290/70; G01B 9/02042;
(Continued)

(56) References Cited

U.S. PATENT DOCUMENTS 5,864,394 A 1/1999 Jordan, III et al.
5,875,029 A 2/1999 Jann et al.
(Continued)

FOREIGN PATENT DOCUMENTS

WO 2004072629 A1 8/2004

OTHER PUBLICATIONS

Larkin, Kieran G., "Efficient nonlinear algorithm for envelope detection in white light interferometry," J. Opt. Soc. Am. A/ vol. 13, No. 4, Apr. 1996, pp. 832-843.
(Continued)

*Primary Examiner* — Michael P LaPage
(74) *Attorney, Agent, or Firm* — Paradice and Li LLP

(57) ABSTRACT

An optical metrology device, such as an interferometer, detects sub-resolution defects on a sample, i.e., defects that are smaller than a pixel in the detector array of the interferometer. The optical metrology device obtains optical metrology data at each pixel in at least one detector array and determines parameter values of a signal model for a pixel of interest using the optical metrology data received by a plurality of pixels neighboring a pixel of interest. A residual for the pixel of interest is determined using the optical metrology data received by the pixel of interest and determined parameter values for the signal model for the pixel of interest. A defect, which may be smaller than the pixel of interest can then be detected based on the residual for the pixel of interest.

51 Claims, 7 Drawing Sheets

(51) Int. Cl.
*G01N 21/956* (2006.01)
*G02B 27/28* (2006.01)
*G02B 21/14* (2006.01)
*G01N 21/94* (2006.01)
*G01N 21/21* (2006.01)
*G01N 21/95* (2006.01)
*H01L 21/66* (2006.01)
*G02B 27/58* (2006.01)

(52) U.S. Cl.
CPC .............. *G01N 21/21* (2013.01); *G01N 21/94* (2013.01); *G01N 21/9501* (2013.01); *G01N 21/956* (2013.01); *G01N 21/95607* (2013.01); *G02B 21/14* (2013.01); *G02B 27/286* (2013.01); *G01B 9/02042* (2013.01); *G01B 2290/70* (2013.01); *G01N 2021/8848* (2013.01); *G01N 2201/0683* (2013.01); *G02B 27/58* (2013.01); *H01L 22/12* (2013.01)

(58) Field of Classification Search
CPC ...... G02B 27/286; G02B 21/14; G02B 27/58; H01L 22/12
See application file for complete search history.

(56) References Cited

U.S. PATENT DOCUMENTS

| | | | |
|---|---|---|---|
| 6,081,325 A * | 6/2000 | Leslie ................... | G01N 21/94 356/237.2 |
| 6,295,382 B1 | 9/2001 | Karanovic | |
| 6,747,697 B1 | 6/2004 | Lin et al. | |
| 6,928,185 B2 * | 8/2005 | Yonezawa ........ | G01N 21/95607 348/125 |
| 7,230,717 B2 | 6/2007 | Brock et al. | |
| 7,433,031 B2 * | 10/2008 | Xu ......................... | G01N 21/21 356/237.2 |
| 7,440,092 B2 * | 10/2008 | Shibata .............. | G01N 21/9501 356/237.2 |
| 7,463,765 B2 | 12/2008 | Messina et al. | |
| 7,532,318 B2 | 5/2009 | Meeks et al. | |
| 7,684,032 B1 | 3/2010 | Meeks | |
| 7,864,334 B2 | 1/2011 | Jeong | |
| 8,000,905 B1 * | 8/2011 | Chen ................... | G01N 21/8851 702/35 |
| 8,275,573 B1 | 9/2012 | Schmit et al. | |
| 9,013,688 B2 | 4/2015 | Gutman | |
| 9,235,885 B2 | 1/2016 | Amzaleg et al. | |
| 2005/0046865 A1 | 3/2005 | Brock et al. | |
| 2006/0067571 A1 | 3/2006 | Onishi | |
| 2007/0252986 A1 | 11/2007 | Sandstrom | |
| 2009/0037134 A1 | 2/2009 | Kulkarni et al. | |
| 2009/0248340 A1 * | 10/2009 | Tian ........................ | G01B 11/24 702/82 |
| 2013/0271595 A1 * | 10/2013 | Hiroi ..................... | G06T 7/0004 348/80 |
| 2016/0061745 A1 * | 3/2016 | Chen ................... | G01N 21/9501 356/237.5 |
| 2016/0163752 A1 | 6/2016 | Sambongi et al. | |
| 2016/0292840 A1 | 10/2016 | Konecky | |
| 2016/0373664 A1 | 12/2016 | Wei | |
| 2017/0016715 A1 | 1/2017 | Heidrich et al. | |
| 2017/0082425 A1 * | 3/2017 | Minekawa ............. | G01B 11/30 |
| 2017/0102339 A1 * | 4/2017 | Honda ............... | G01N 21/8806 |

OTHER PUBLICATIONS

Brock, Neal J. et al, "A pixelated polarizer-based camera for instantaneous interferometric measurements," SPIE vol. 8160-32.
Kimbrough, Brad et al., "Dynamic surface roughness profiler," SPIE vol. 8126, 81260H-1.
U.S. Appl. No. 16/197,849, filed Nov. 21, 2018.
Tobin, Kenneth W., "Inspection in Semiconductor Manufacturing," Webster's Encyclopedia of Electrical and Electronic Engineering, vol. 10, pp. 242-262, Wiley & Sons, NY, NY, 1999.
U.S. Appl. No. 16/197,929, filed Nov. 21, 2018.
International Search Report and Written Opinion dated Feb. 27, 2019 from PCT/US2018/062821 filed Nov. 28, 2018.
International Search Report and Written Opinion dated Mar. 11, 2019 from PCT/US2018/062825 filed Nov. 28, 2018.

* cited by examiner

SUB-RESOLUTION DEFECT DETECTION

CROSS REFERENCE TO RELATED APPLICATIONS

This application claims priority under 35 USC 119 to U.S. Provisional Application No. 62/593,777, entitled "SUB-RESOLUTION DEFECT DETECTION," filed Dec. 1, 2017, and to U.S. Provisional Application No. 62/738,765, entitled "SUB-RESOLUTION DEFECT DETECTION," filed Dec. Sep. 28, 2018, both of which are incorporated herein by reference in their entireties.

FIELD OF THE INVENTION

The present invention is related to optical metrology, and in particular to optical metrology for detecting defects on a sample.

BACKGROUND

Semiconductor and other similar industries, often use optical metrology equipment to provide non-contact evaluation of substrates during processing. One type of evaluation that is performed using optical metrology is defect inspection. Defects, such as particles or other irregularities on a sample, may interfere with the performance of resulting devices. Conventionally, optical tools used to detect defects use bright-field and dark-field inspection. Bright-field and dark-field detection tools detect defects based on the scattering of light caused by defects.

Interferometers are optical metrology tools capable of measuring small height differences on an object by determining the phase of the interference signal at each pixel. Determining the phase of the signal requires obtaining more than one sample from each point on the wafer. In a conventional scanning interferometer, the phase is modified by moving the sample or reference surface along an axis perpendicular to the surface, typically in steps that produce a quarter-wave change in phase of the interferogram. Processing at least three such samples allows the signal phase and hence vertical location of the surface to be determined, at the expense of the time taken to acquire these samples. Random defects are rare and are conventionally detected by comparing a signal from each pixel with a reference value, which is conventionally obtained from one or more areas with the same pattern but at different locations on the wafer. The smallest detectable defect is one where the signal difference from the reference value is at the same level as the uncertainty in the measurement.

Defect detection requires acquiring data from large portions of a wafer, and often from the whole wafer. As the size of semiconductor devices continues to shrink and designs become more complex, it is necessary to detect smaller defects, which is increasingly difficult with conventional optical inspection tools.

SUMMARY

An optical metrology device, such as an interferometer, detects sub-resolution defects on a sample, i.e., defects that are smaller than a pixel in the detector array of the interferometer. The optical metrology device obtains optical metrology data at each pixel in at least one detector array and determines parameter values of a signal model for a pixel of interest using the optical metrology data received by a plurality of pixels neighboring a pixel of interest. A residual for the pixel of interest is determined using the optical metrology data received by the pixel of interest and determined parameter values for the signal model for the pixel of interest. A defect, which may be smaller than the pixel of interest can then be detected based on the residual for the pixel of interest.

In one implementation, a method of detecting a sub-resolution defect on a sample includes obtaining optical metrology data from the sample, the optical metrology data comprising an intensity value at each pixel in at least one detector array; determining parameter values for a signal model for a pixel of interest in the at least one detector array based on the optical metrology data received by a plurality of pixels neighboring the pixel of interest; determining a residual for the pixel of interest using the optical metrology data received by the pixel of interest and determined parameter values for the signal model for the pixel of interest; and detecting a defect, which is smaller than the pixel of interest, at a location on the sample corresponding to the pixel of interest using the residual for the pixel of interest.

In one implementation, an optical metrology apparatus configured to detect a sub-resolution defect includes a light source that produces an illumination beam; an objective lens that directs the illumination beam to be incident on the sample and to receive light reflected by the sample, at least one detector array that receives the light after it is reflected by the sample and acquires optical metrology data from the light, wherein the optical metrology data comprises an intensity value at each pixel in the at least one detector array; and at least one processor coupled to the at least one detector array, the at least one processor obtains the optical metrology data, determines parameter values for a signal model for a pixel of interest in the at least one detector array based on the optical metrology data received by a plurality of pixels neighboring the pixel of interest, determines a residual for the pixel of interest using the optical metrology data received by the pixel of interest and determined parameter values for the signal model for the pixel of interest, and detects a defect, which is smaller than the pixel of interest, at a location on the sample corresponding to the pixel of interest using the residual for the pixel of interest.

In one implementation, an apparatus configured to detect a sub-resolution defect includes means for obtaining optical metrology data from the sample, the optical metrology data comprising an intensity value at each pixel in at least one detector array; means for determining parameter values for a signal model for a pixel of interest in the at least one detector array based on the optical metrology data received by a plurality of pixels neighboring the pixel of interest; means for determining a residual for the pixel of interest using the optical metrology data received by the pixel of interest and determined parameter values for the signal model for the pixel of interest; and means for detecting a defect, which is smaller than the pixel of interest, at a location on the sample corresponding to the pixel of interest using the residual for the pixel of interest.

DETAILED DESCRIPTION

Figure 1:
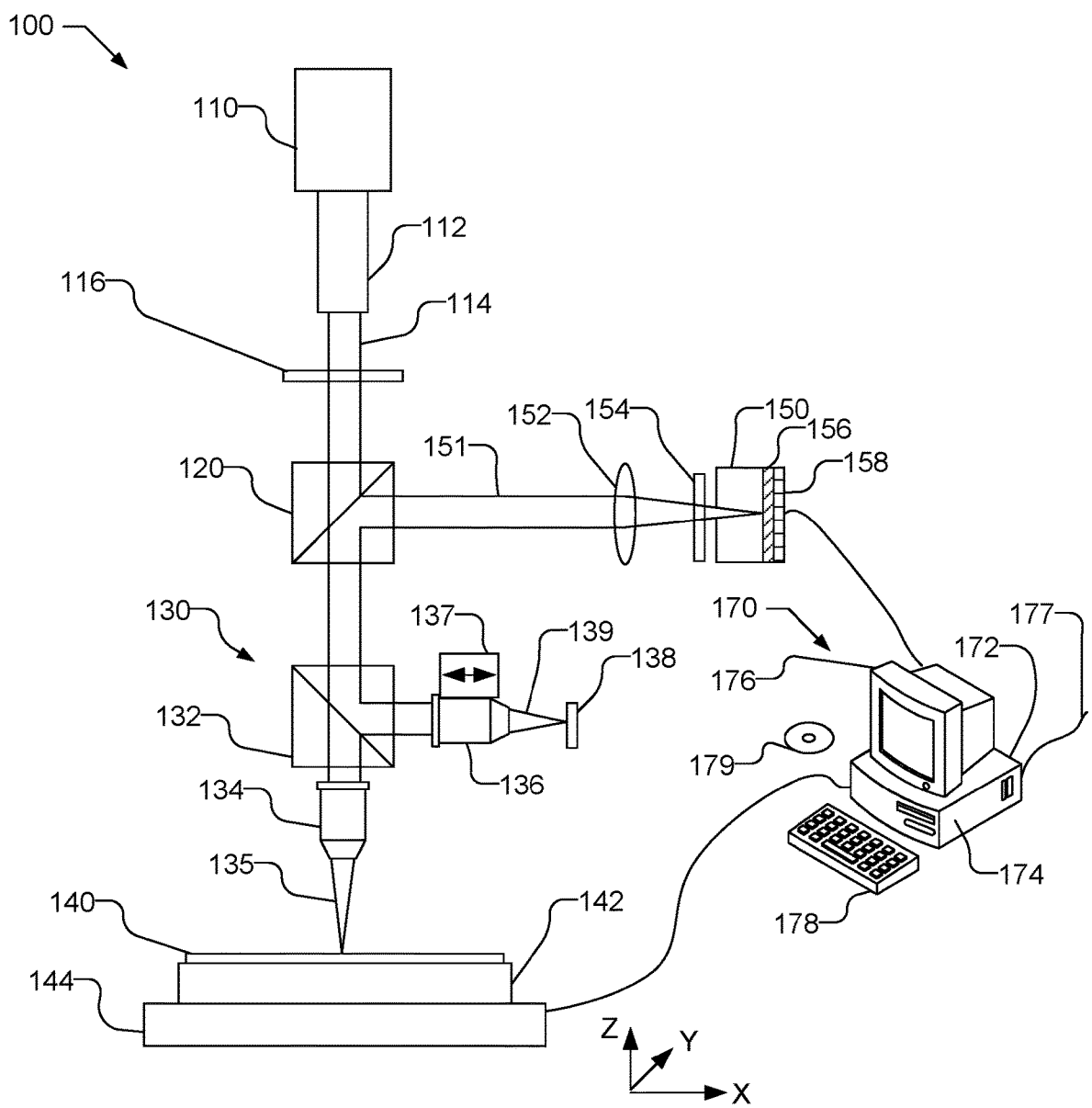
FIG. 1 illustrates a schematic view of an interferometer that is capable of detecting sub-resolution defects on a sample.

FIG. 1 illustrates a schematic view of an optical metrology device 100 that is capable of detecting sub-resolution defects on a sample 140. Optical metrology device 100 is illustrated as an interferometer, which may be a phase shifting interferometer, and sometimes may be referred to herein as interferometer 100. The optical metrology device 100 may use a surface measurement to find a defect located within a single pixel based on a discrepancy between the measured signal at the pixel and a predicted signal for the pixel that is generated based on measured signals from neighboring pixels. A die-to-die comparison may be used to confirm that the discrepancy is a defect as opposed to part of the intended structure. While a phase shifting interferometer is discussed herein, it should be understood that other types of interferometers may be used, or other types of optical metrology devices, such as a reflectometer or ellipsometer, may be used detect sub-resolution defects on a sample based on the disclosure herein.

While an interferometer may be used to detect defects by comparing the height and signal intensity at each pixel with a reference value, which may be obtained from one or more areas with the same pattern but at different locations on the wafer, there are limitations to such an approach. For example, the smallest detectable defect is one where the height or signal intensity difference from the reference value is at the same level as the uncertainty in the measurements. Using a discrepancy between the measured signal at pixel of interest and a predicted signal for that pixel generated based on signals from neighboring pixels provides better resolution for detecting defects located within a single pixel.

Defect detection requires acquiring data from large portions of a wafer, and often from the whole wafer. As the size of semiconductor devices continues to shrink and designs become more complex, it is necessary to detect smaller defects, which is increasingly difficult with conventional optical inspection tools. Defects that are smaller than the instrument resolution perturb the measured height or signal less than larger ones, and so the smallest detectable defect size is set by the instrument resolution and signal noise. The lateral resolution of interferometers is limited by the smaller of the optical resolution of the system and the size of the pixels in the detector. The speed of an interferometer used in defect detection therefor depends on the pixel size, which also sets the lower limit to the size of defects that can be detected; the imaged field of view; and the time taken to acquire height data from each field of view. A scanning interferometer, in which at least three samples must be taken at different times, will be much slower than phase shifting interferometer 100, which may acquire phase data from a single image. Thus, a phase shifting interferometer 100 in which the pixel size is matched to the optical resolution to maximize the area inspected in each image acquisition while minimizing the size of defects that may be detected may be preferable over a scanning interferometer for defect inspection.

Acquiring phase data from a single image may be performed by the phase shifting interferometer 100 by modifying the signal phase in different pixels in a single detector array, e.g., using a micropolarizer array 156. Use of a micropolarizer array 156 to modify the signal phase in different pixels, however, increases the effective pixel size of the detector. Accordingly, the increase in effective pixel size, however, may be offset with the detection of sub-resolution defects as discussed herein.

The interferometer 100 is illustrated as including a light source 110 to produce polarized light, an interferometric objective 130 to produces orthogonally polarized test and reference beams and a camera 150 that includes the pixel-level micropolarizer. The light source 110 in the interferometer 100 may be a narrow band light source that produces a desired wavelength of light, e.g., approximately 460 nm. The light source 110, for example, may be a high brightness LED source or laser source, or a broad band light source with appropriate filters. A Kohler illuminator 112 produces an image of the light source 110 at the entrance pupil of an interferometric objective 130. The illumination 114 from the Kohler illuminator 112 passes through a polarizer 116 before being directed to a beam splitter 120. Other illumination approaches, such as critical illumination, may be used in place of Kohler illumination. The polarizer 116 may be, e.g., a linear polarizer, but in some embodiments may be a circular polarizer, and may be adjustable to maximize fringe contrast. The beam splitter 120, which may be a non-polarizing 50/50 beam splitter, directs, e.g., transmits, the polarized light to an interferometric objective 130. The use of polarized light is required if the phase detector relies on polarization, as is the case with a wire polarizer grid, but in other embodiments, e.g. where different materials or material thicknesses are used to introduce a phase lag in one of the split paths, e.g., the reference beam 139 path, unpolarized light may be used.

The interferometric objective 130 is configured to split incident light into a test beam that is reflected from the sample and a reference beam that is reflected from a reference surface and to recombine the reflected test beam from the sample with the reflected reference beam from the reference surface. The interferometric objective 130 is illustrated, by way of example, as a Linnik geometry, including a polarizing beam splitter 132, a sample objective 134 for imaging the surface of the test sample, and a complementary reference objective 136 and a reference mirror 138. If desired, other interferometric objectives may be used, such as a Michelson or Mirau objective. The choice of objective may be restricted depending on the polarization state of light in the instrument.

FIG. 1 illustrates an actuator 137 as attached to the reference objective 136 to move the reference objective 136 perpendicular to the vertical direction (Z axis) in order to vary the optical path difference between a test beam 135 incident on the sample 140 and a reference beam 139 incident on the reference mirror 138 in order to focus the optical system, e.g., after moving the sample 140 to a new measurement location. In practice, the reference objective 136 alone, the reference mirror 138 alone, the sample, or the entire optical assembly of the interferometric objective 130 may be moved along the optical axis to alter the optical path difference between the test beam and the reference beam. It should be understood, however, that with other interferometric objectives, the path difference may be varied by moving the reference mirror in a direction parallel to the vertical direction. From an optical perspective, there is no difference between the sample or the entire imaging system moving relative to each other; however, there are practical implications, i.e., the mass of the optical system may limit the selection of the stage which may in turn limit the minimum stage accuracy. If desired, other means of changing the optical path difference may be employed, including changing the wavelength of light.

As illustrated, the test beam 135 from the sample objective 134 is incident on the sample 140, which is held on a chuck 142 mounted on a stage 144. The stage 144 is capable of horizontal motion in either Cartesian (i.e., X and Y) coordinates, or Polar (i.e., R and θ) coordinates or some combination of the two. The stage may also be capable of vertical motion along the Z coordinate.

The test beam 135 is reflected from the sample 140 and the resulting reflected beam passes back through the sample objective 134 and is combined with the reflected reference beam 139 by the polarizing beam splitter 132. The resulting combined beam 151 is directed, e.g., reflected, by the beam splitter 120 towards the camera 150. It should be understood that if desired, the beam splitter 120 may reflect the illuminating light from the light source 110 and transmit the light reflected from the sample 140. It should also be understood that the beam splitter 132 need not be a polarizer if the detector relies on a method other than polarization to detect signal phase. The reflected beam is imaged by a lens 152 onto the camera 150. If required, an output polarizer 154 is positioned between the lens 152 and the camera 150. The output polarizer 154 may be, e.g., a quarter wave plate at 45 degrees, to convert the p-polarized test beam from the sample 140 into right-hand circular polarization and the s-polarized reference beam from the reference mirror 138 into left hand circular polarization. The camera 150 includes a pixel-level micropolarizer array 156 before a detector array 158, such as a CCD array, which are located in substantially the same image planes. The combined beams pass through the micropolarizer array 156 forming an interference pattern on the detector array 158. The micropolarizer array 156 and detector array 158 may be, e.g., a pixelated polarization mask based phase sensor, produced by 4D Technology Corporation.

Figure 2A:
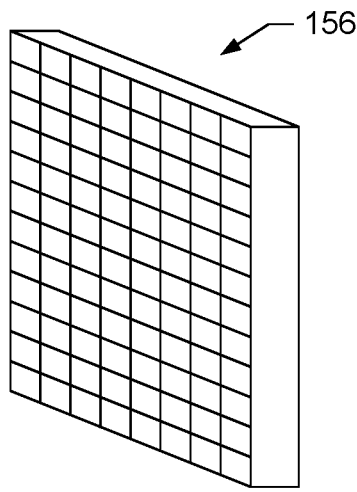
FIG. 2A illustrates a side perspective view of the micropolarizer array that may be used with the interferometer of FIG. 1.
Figure 2B:
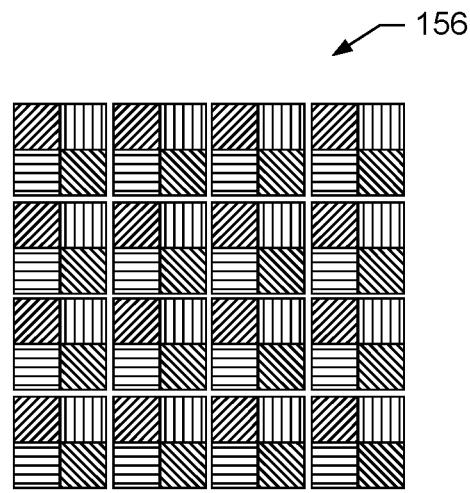
FIG. 2B illustrates a top plan view of the micropolarizer array that may be used with the interferometer of FIG. 1.
Figure 2C:
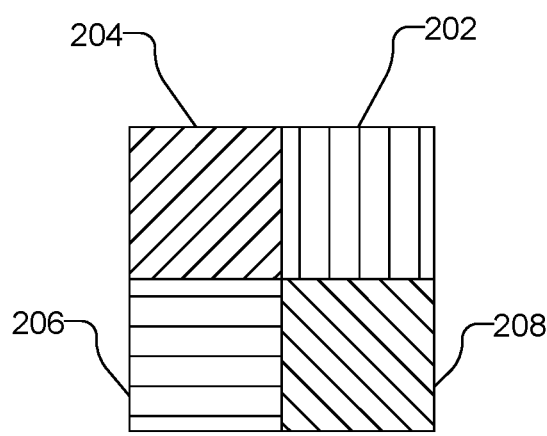
FIG. 2C illustrates a portion of the micropolarizer array that may be used with the interferometer of FIG. 1.
Figure 2D:
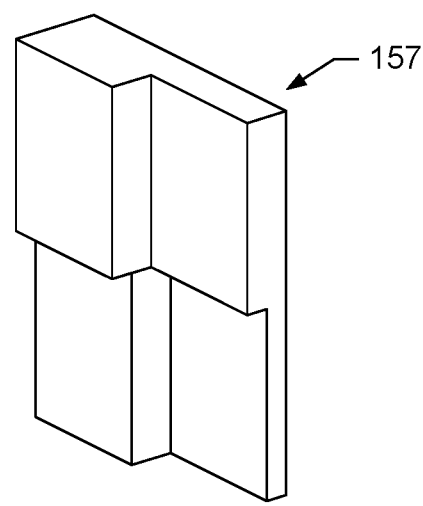
FIG. 2D illustrates a portion of a phase delay element.

FIGS. 2A and 2B illustrate a side perspective view and a top plan view of the micropolarizer array 156. FIG. 2C illustrates a portion of the micropolarizer array 156 that includes a 2×2 array of polarizer pixels, 202, 204, 206, and 208 with four discrete polarizations (0°, 45°, 90°, 135°) that is repeated over the entire micropolarizer array 156, so that the micropolarizer array includes a repeated array of micropolarizer pixels having discrete polarizations. The polarizer pixels 202, 204, 206, and 208 orientations at 0°, 45°, 90°, and 135° enable interference with phase lags of 0°, 90°, 180°, and 270°, respectively, between the test beam 135 and reference beam 139. The micropolarizer pixels have a size and spacing that match the size and spacing of the pixels in the detector array 158, so that each pixel in the detector array 158 is matched, i.e., aligned, with a micropolarizer element of the micropolarizer array 156. Alternatively, in place of the micropolarizer array 156, a polarizing detector may use a phase mask that includes a repeated array of phase delay elements, one such array 157 being illustrated in perspective view in FIG. 2D. The phase mask may be a birefringent quartz mask etched to different depths in an array of squares matching the camera pixel size, each one introducing a potentially different delay between the reference and sample beams. The phase mask comprises a repeated array of phase delay elements having discrete phase delays that is aligned with the pixels of the detector array. Manufacturing techniques for such a mask are known in the semiconductor industry, where phase change is commonly used in photomasks for lithography. Depth control in each phase element may be improved by calibrating the phase delay at each pixel.

The interferometer 100 uses polarization data to determine a phase difference between the test beam 135 and the reference beam 139, which are orthogonally polarized by the polarizing beam splitter 132. The output polarizer 154, e.g., the quarter wave plate, converts the linearly polarized test beam 135 and reference beam 139 to left and right hand circular polarizations, which interfere after passing through the micropolarizer array 156. The detector array 158 receives the resulting light after interference and the intensity at each pixel in the detector array 158 is converted to an electrical charge.

The camera 150, e.g., the detector array 158, is coupled to a computer 170, such as a workstation, a personal computer, central processing unit or other adequate computer system, or multiple systems. The computer 170 is preferably included in, or is connected to or otherwise associated with interferometer 100. The computer 170 may also control the movement of the stage 144, as well as control the operation of the chuck 142. The computer 170 also collects and analyzes the interferometric data obtained from the camera 150 as discussed herein. For example, the computer 170 may analyze the interferometric data to determine one or more physical characteristics of the sample 140, such as the presence of a sub-resolution defect, as discussed below. The computer 170, which includes at least one processor 172 with memory 174, as well as a user interface including e.g., a display 176 and input devices 178. A non-transitory computer-usable storage medium 179 having computer-readable program code embodied may be used by the computer 170 for causing the at least one processor to control the interferometer 100 and to perform the functions including the analysis described herein. The data structures and software code for automatically implementing one or more acts described in this detailed description can be implemented by one of ordinary skill in the art in light of the present disclosure and stored, e.g., on a computer-usable storage medium 179, which may be any device or medium that can store code and/or data for use by a computer system such as processor 172. The computer-usable storage medium 179 may be, but is not limited to, magnetic and optical storage devices such as disk drives, magnetic tape, compact discs, and DVDs (digital versatile discs or digital video discs). A communication port 177 may also be used to receive instructions that are used to program the computer 170 to perform any one or more of the functions described herein and may represent any type of communication connection, such as to the internet or any other computer network. The communication port 177 may further export signals, e.g., with measurement results and/or instructions, to another system, such as external process tools, in a feed forward or feedback process in order to adjust a process parameter associated with a fabrication process step of the samples based on the measurement results. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described.

Thus, the determined one or more physical characteristics of the sample 140, such as the presence of a defect, as discussed below, may be determined by the computer system 170 and may be communicated and stored, e.g., in memory or in a database. The defect data may be communicated to adjust one or more process tools associated with particular fabrication process steps in the fabrication sequence (e.g., process tools responsible for the detected defects) or to adjust the fabrication sequence of the sample itself, e.g. by rejecting or discarding the sample or a portion of the sample.

Figure 3A:
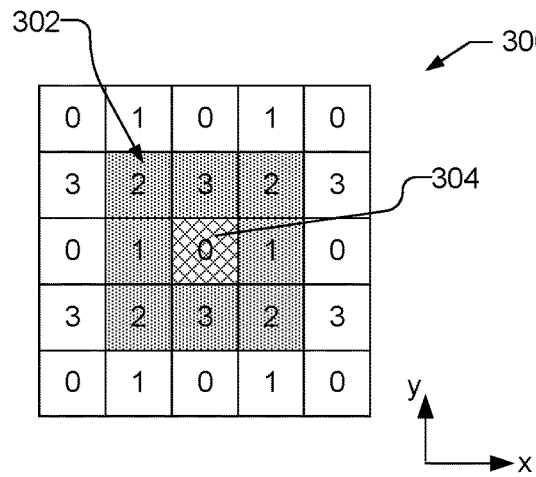
FIGS. 3A and 3B illustrate plan views of a portion of the micropolarizer array and the detector array in the interferometer, and respectively illustrate a 3×3 kernel and a 2×2 kernel for detecting a defect at a pixel of interest.
Figure 3B:
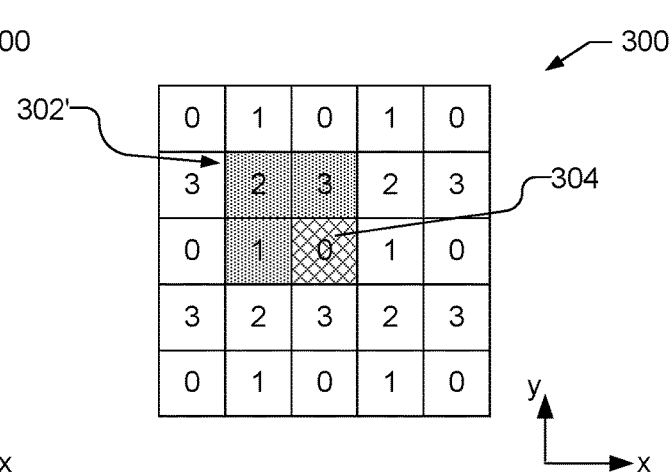

FIGS. 3A and 3B each illustrate plan views of a portion of detector arrays 300, which is, e.g., a portion of the micropolarizer array 156 and detector array 158. FIGS. 3A and 3B illustrate reference numbers i in the center of each pixel, which represent the phase shift between the interfering test beam 135 and reference beam 139 at the pixel, e.g., 0 represents a polarizer orientation of 0° enabling interference between in-phase (i.e., 0°) components of the test beam 135 and reference beam 139, 1 represents a polarizer orientation of 45° enabling interference between in-phase quadrature (i.e., 90°) components, 2 represents a polarizer orientation of 90° enabling interference between out-of-phase (i.e., 180°) components, and 3 represents a polarizer orientation of 135° enabling interference between out-of-phase quadrature (i.e., 270°) components. Each pixel in the detector array 300 receives interferometric data from a sample, e.g., sample 140, using the interferometer 100. The interferometric data received at each pixel in the detector array 300 is an intensity value from the interfering test beam and reference beam after passing through a polarizer in the micropolarizer array 156 aligned with the pixel in the detector array 158. As discussed above, a phase mask 157 that includes a repeated array of phase delay elements, e.g., using different thicknesses of quartz, can also be used to produce signals with different but known phase shifts at each pixel. It should be understood that while FIGS. 2B and 2C and FIGS. 3A and 3B illustrate the use of arrays with four different phase shifts arranged in a specific 2×2 matrix, other matrix arrangements are possible, and if desired, more than four different phase shifts may be used. Other types of arrangements that may be used are described further in the U.S. patent application Ser. No. 16/197,929, entitled "Interferometer with Pixelated Phase Shift Mask," filed Nov. 21, 2018, which is incorporated by reference in its entirety.

At each pixel (x,y) in the detector array 158, the received light produces a signal $S_i$ given by $$S_i(x, y) = a\cos\left(kz + \frac{i\pi}{2}\right) + b. \qquad \text{eq. 1}$$

In equation 1, $S_i$ is the intensity at the pixel (x,y) in the detector array 300, i is the reference number for pixel (x,y) as provided in FIGS. 3A and 3B, k is the spatial frequency of the interference fringe pattern, z is the surface height at the pixel relative to some origin, and a and b are related to magnitude of the signal, where $$a = 2\sqrt{I_r I_t}; \text{ and}$$

$$b = I_r + I_t \qquad \text{eq. 2}$$

and $I_r$ and $I_t$ in equation 2 are the intensities of the reference beam 139 and test beam 135, respectively, and depend on the intensity of the illumination source and the reflectance of the sample and reference mirror, respectively. Referring to equation 1, kz represents the phase value of the signal from which we define z=0 as a plane with zero phase. The spatial frequency k is related to the mid-point wavelength of the source spectrum, $\lambda_0$ by equation 3:

$$k = \frac{4\pi}{\lambda_0}. \qquad \text{eq. 3}$$

Thus, the intensity value $S_i$ at each pixel (x,y) in the detector array is a function of at least one of reflectivity and phase.

Using the signals received by the detector array 300, and an interference signal model based on $S_i(x,y)$ from equation 1, it is possible to detect a defect that is smaller than a single pixel in the detector array 300, i.e., a sub-resolution defect. The presence of a defect on the sample may change one or both of the phase value (kz) and magnitude (a,b) in the signal $S_i(x,y)$ resulting in an "abnormal" signal. When the underlying pattern on the sample is by design the same for each of the four pixels, an abnormal signal may be detected by comparing the received signal from a single pixel, e.g., the pixel of interest 304 (illustrated with cross-hatching in FIGS. 3A and 3B), to a predicted signal for that pixel based on an interference signal model with a phase value (kz) and magnitude (a,b) determined from neighboring pixels. For example, as illustrated in FIG. 3A, the neighboring pixels may be pixels in a 3×3 kernel 302 (illustrated with shading in FIG. 3A) centered on the pixel of interest 304. If desired, fewer than all the pixels in the 3×3 kernel 302 shown in FIG. 3A may be used. For example, there are two unknowns in equation 1, surface height z and the sample reflectance, which is complex, and thus, there are three unknown numbers. Accordingly, measurements from three or more neighboring pixels in the 3×3 kernel 302 may be used, e.g., where at least three different phase shifts are measured. As illustrated in FIG. 3B, the neighboring pixels may be pixels in a 2×2 kernel 302' (illustrated with shading in FIG. 3B) associated with the pixel of interest 304. Thus, signals may be acquired from the four pixels in the 2×2 kernel 302' illustrated in FIG. 3B, where signals from three neighboring pixels (illustrated with shading in FIG. 3B) may be used to determine a predicted signal for the pixel of interest 304 (illustrated with cross-hatching in FIG. 3B). It should be understood that the pixel of interest 304 may be located at a different location within (or outside) the 2×2 kernel 302'.

For example, using the intensities $S_i$ from four pixels with different values of i, and assuming that a and b are the same at each pixel, then the parameters z, a and b in equation 1 can be calculated from equations 4, 5 and 6.

$$z = \frac{\lambda}{4\pi}\tan^{-1}\left(\frac{S_1 - S_3}{S_2 - S_4}\right) \qquad \text{eq. 4}$$

-continued $$a = \frac{S_1 - S_3}{2\sin(kz)} \quad \text{eq. 5}$$

$$b = S_1 - a\sin(kz) \quad \text{eq. 6}$$

Other means of calculating these parameters from four measured intensities, or from a different number of intensities, are possible as will be apparent to those of ordinary skill in the art.

By way of example, the surface height z may be determined using three known phase shifts. For example, with three samples ($S_i$, i=1,2,4), the surface height z may be determined from:

$$\tan(kz) = 2\left(\frac{S_4 - S_1}{S_4 - S_2}\right) - 1. \quad \text{eq. 7}$$

It should be understood that different samples $S_i$ may be selected, and that other means of calculating these parameters from three measured intensities are possible as will be apparent to those of ordinary skill in the art.

By comparing the predicted signal for the pixel of interest, determined from the neighboring pixels, to the received signal from the pixel of interest, a residual may be produced. The residual may be considered to indicate an abnormal signal and, thus, the presence of a defect at the pixel of interest, e.g., if the residual is greater than a threshold. A die-to-die comparison may be performed to confirm the presence of a defect, e.g., by determining whether a defect (or abnormal signal) is likewise found at a location on a different die that corresponds to the location associated with the pixel of interest, which would indicate that the abnormal signal is caused by an intended structure design and not a defect. Defect detection may be performed for the entire area of interest on the sample by treating each pixel in the detector array 300 individually as a pixel of interest with an associated array of neighboring pixels. By contrast with non-interferometric instruments, which find only those defects that change the signal intensity, this technique additionally detects transparent defects that modify only the phase of the signal. Additionally, a combination of intensity and phase may be used to detect defects.

It should be understood that because the interference signal model for the pixel of interest is produced based on neighboring pixels, the pattern on the sample underlying the neighboring pixels and the pixel of interest should be nominally the same, i.e., either there is no pattern or any pattern is sub-resolution so that the area appears constant. Thus, the plurality of pixels neighboring the pixel of interest are pixels that correspond to areas on the sample with a same reflectance and relative surface height as an area on the sample corresponding to the pixel of interest. The neighboring pixels may be any that are within the same area of uniform pattern, i.e., those for which the surface phase, kz, value is the same. The neighboring pixels may be adjacent to the pixel of interest, but may alternatively or additionally be non-adjacent to the pixel of interest. Further, the neighboring pixels may be contiguous or non-contiguous pixels and may surround or only partly surround the pixel of interest 304. The neighboring pixels may be immediately adjacent or may not be immediately adjacent to the pixel of interest.

While the pattern on the sample should be constant, the sample itself may be planar or non-planar, e.g., dishing or other curvature may be present. The curvature of the sample surface, as well as defects on the non-planar region of the sample may be detected. By way of example, interference signal models for pixels of interest may be determined from neighboring pixels based on an assumption that the sample surface is planar. The received signal from each pixel of interest may be compared to a predicted signal for that pixel based on the interference signal model determined assuming the sample surface is planar. Where a curvature of the sample surface is present, a cluster of defects will be detected due to the curvature of the sample assuming that the curvature is sufficient to produce a residual that is greater than the threshold. The cluster of defects may indicate curvature of the sample surface, and accordingly, the interference signal model for each pixel of interest may be determined from neighboring pixels using a polynomial fit to account for the curvature and varying the height z from pixel to pixel in a realistic fashion. The received signal from each pixel of interest may then be compared to the predicted signal for that pixel based on the interference signal model determined assuming the sample surface is curved. If the resulting residuals produced assuming that the sample surface is curved are less than the threshold, it may be determined that the sample surface is curved, and that the curvature used to generate the interference signal models is accurate. In addition, an outlier pixel of interest may be used as an indication of a defect in addition to the curvature of the sample surface. Using multiple pixels in this way will reduce the impact of random noise in the surface height of a single pixel, and so improve the signal to noise ratio in the measurement of z. This would allow the detection threshold to be lowered without increasing the probability of falsely detecting defects, and so allow detection of defects with smaller height differences relative to a reference surface than if they were treated as isolated defects.

Figure 4:
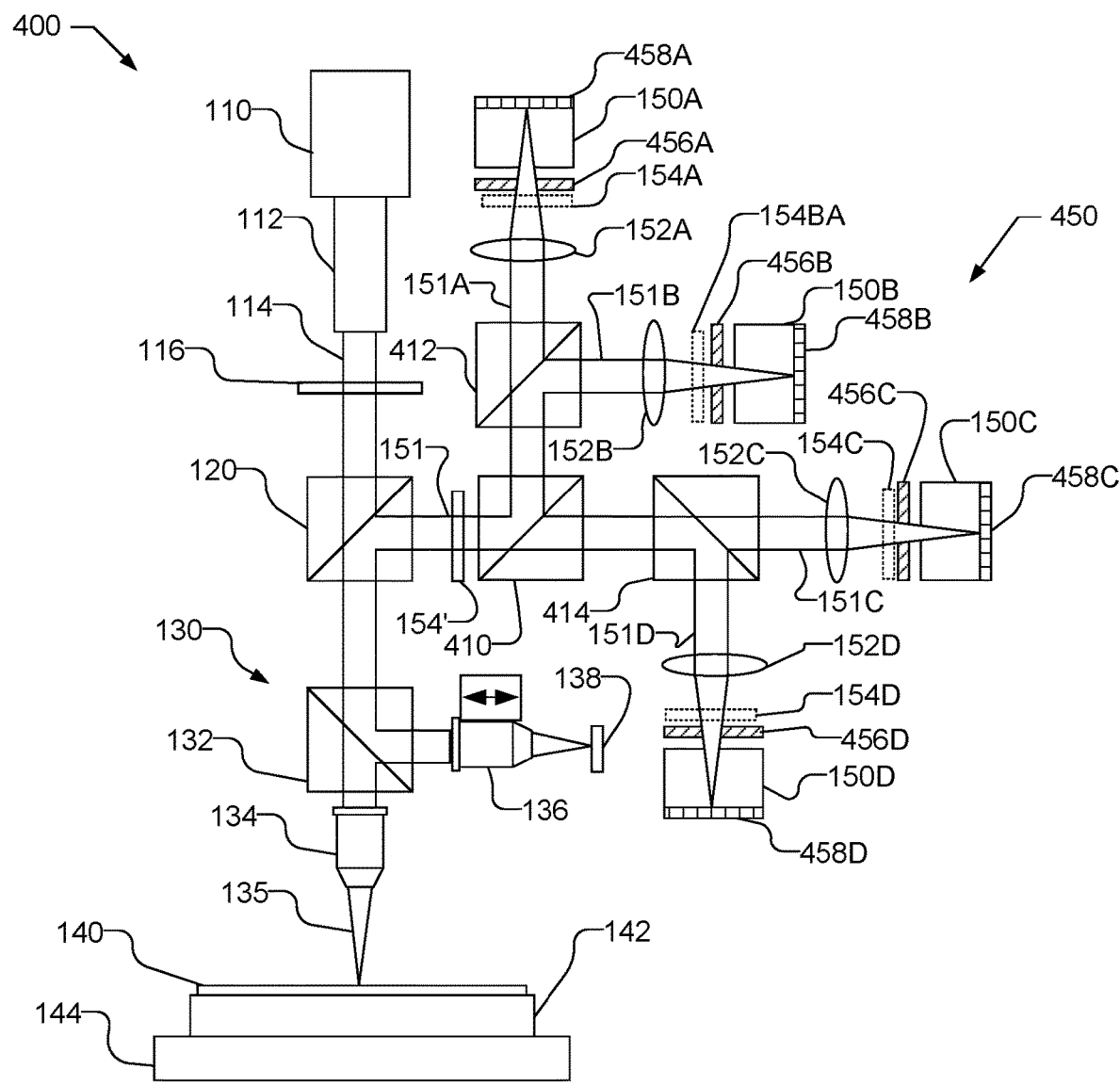
FIG. 4 illustrates a schematic view of another interferometer that is capable of detecting sub-resolution defects on a sample.

FIG. 4 illustrates a schematic view of another interferometer 400, similar to interferometer 100 shown in FIG. 1, like designated elements being the same, that may detect sub-resolution defects on a sample 140 based on the disclosure herein. Unlike interferometer 100, interferometer 400 does not use a pixel-level micropolarizer array positioned before a single detector array, but instead uses a plurality of polarizers before a corresponding plurality of detector arrays.

As illustrated in FIG. 4, the resulting combined beam 151 is directed, e.g., reflected, by the beam splitter 120 towards an array 450 of separate detectors. A first beam splitter 410 splits the beam 151 into two separate beams, each of which is further split by beam splitters 412 and 414 forming four beams. Each of the resulting four beams 151A, 151B, 151C, and 151D is directed to a separate detector. For example, beam 151A is imaged by a lens 152A onto the camera 150A. If desired, a single output polarizer 154', e.g., a quarter wave plate, may be positioned before the beam splitter 410, or alternatively, as illustrated with dotted boxes, separate output polarizers 154A, 154B, 154C, and 154D may be located before each separate detector, e.g., between the lens and the camera. The output polarizer 154' (or output polarizers 154A, 154B, 154C, and 154D) may be, e.g., a quarter wave plate at 45 degrees, to convert the p-polarized test beam from the sample 140 into right-hand circular polarization and the s-polarized reference beam from the reference mirror 138 into left hand circular polarization. If the incident polarization is circular, there is no need for a quarter wave plate. With the quarter wave plate 154' (or 154A, 154B, 154C, and 154D) present, a polarizer 456A may be positioned between the output polarizer and the camera 150A. If desired, polarizer 456A may be positioned elsewhere, e.g., prior to the output polarizer 154A or within the camera 150A. The beam 151A forms an interference pattern on the detector array 458A of the camera 150A. Beam 151B likewise passes through lens 152B, output polarizer 154B, and polarizer 456B, and is received by the detector array 458B of camera 150B. Similarly, beam 151C passes through lens 152C, output polarizer 154C, and polarizer 456C, and is received by the detector array 458C of camera 150C. Beam 151D passes through lens 152D, output polarizer 154D, and polarizer 456D, and is received by the detector array 458D of camera 150D. The pixels of detector arrays 458A, 458B, 458C, and 458D (sometimes referred to collectively as detector arrays 458) are aligned so that they image the same area on the sample 140, where corresponding pixels in the separate detector array 458 correspond to the same location on the sample 140. Each of the detector arrays 458 is coupled to a computer 170, e.g., as illustrated in FIG. 1, for analyzing the interferometric data to determine one or more physical characteristics of the sample 140, such as the presence of a sub-resolution defect.

If desired, the polarizers 456 may be wire grid polarizers or, alternatively, birefringent phase delay elements, which may have different thicknesses of quartz or other suitable material.

Polarizers 456A, 456B, 456C, and 456D have four discrete polarizations, e.g., 0°, 45°, 90°, 135°, thereby enabling interference with phase delays of 0°, 90°, 180°, and 270°, respectively, between the test beam 135 and reference beam 139. Thus, the use of four separate polarizers 456A, 456B, 456C, and 456D (sometimes referred to collectively as polarizers 456) and associated detector arrays 458A, 458B, 458C, and 458D replaces the micropolarizer array 156 with its 2×2 array of polarizer pixels and associated detector array 158 in the interferometer 100. Accordingly, interferometer 400 has 4× the resolution of interferometer 100.

Figure 5:
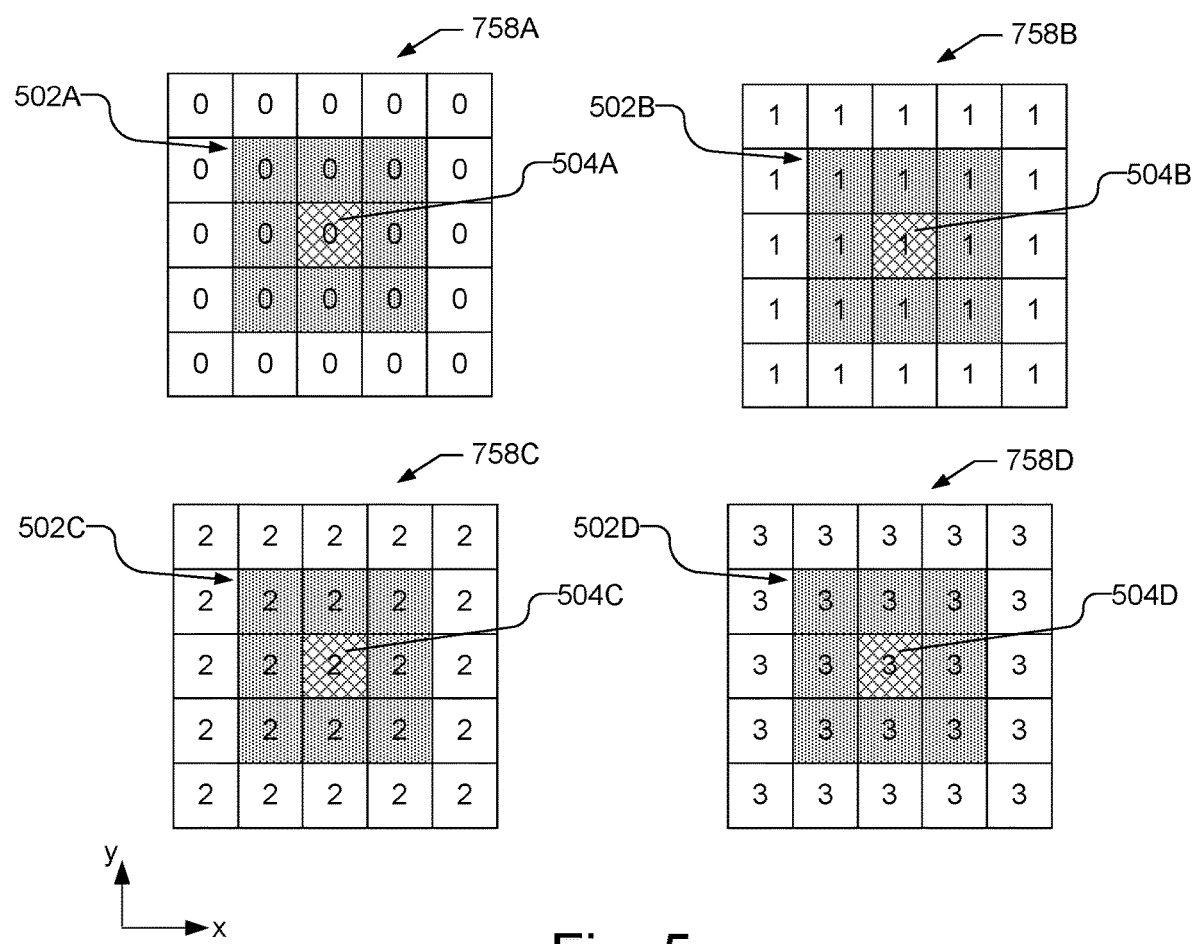
FIG. 5 illustrates a plan view of arrays of pixels, which are portions of a plurality of detector arrays in the interferometer illustrated in FIG. 4 and illustrates 3×3 arrays of pixels neighboring a pixel of interest in each detector array.

FIG. 5 illustrates a plan view of corresponding portions of detector arrays 458A, 458B, 458C, and 458D. Each pixel in the detector arrays 458 receives interferometric data from a sample, e.g., sample 140, using the interferometer 400. The interferometric data received at each pixel in the detector arrays 458 is an intensity value from the interfering test beam 135 and reference beam 139 after passing through corresponding polarizers 456. The pixels in the detector arrays 458 are aligned so that corresponding pixels, e.g., pixels 504A, 504B, 504C, and 504D, receive data from the same location on the sample 140. If desired, the beam may be split into more than four beams, with a corresponding increase in the number of detectors. Alternatively, some or all of the separated beams may be directed towards different parts of a single detector.

Similar to FIG. 3A, FIG. 5 illustrates reference numbers i in the center of each pixel, which represent the phase shift between the interfering test beam 135 and reference beam 139 at the pixel, e.g., 0 represents a polarizer orientation of 0° enabling interference between in-phase (i.e., 0°) components of the test beam 135 and reference beam 139, 1 represents a polarizer orientation of 45° enabling interference between in-phase quadrature (i.e., 90°) components, 2 represents a polarizer orientation of 90° enabling interference between out-of-phase (i.e., 180°) components, and 3 represents a polarizer orientation of 135° enabling interference between out-of-phase quadrature (i.e., 270°) components. Because the interferometer 400 uses four different polarizers 456 in each detector arm, instead of a single micropolarizer array 156, all pixels in a detector array have the same reference numbers i. If desired, phase elements, e.g. ones using different thicknesses of quartz, can also be used to produce signals with different but known phase shifts for each detector array.

Similar to the discussion above, using signals received by the detector arrays 458, and an interference signal model based on $S_i(x,y)$ from equation 1, it is possible to detect a defect that is smaller than a single pixel in the detector arrays 458, i.e., a sub-resolution defect. The presence of a defect on the sample may change one or both of the phase value (kz) and magnitude (a,b) in the signal $S_i(x,y)$ resulting in an "abnormal" signal. When the underlying pattern on the sample is constant, one or more abnormal signals may be detected by comparing the received signals from pixels in the detector arrays 458, e.g., one or more of the pixel of interest 504A, 504B, 504C, and 504D (sometimes collectively referred to as pixels of interest 504) (illustrated with cross-hatching in FIG. 5), to one or more predicted signals for those pixels based on an interference signal model with the a phase value (kz) and magnitude (a,b) determined from one or more corresponding sets of neighboring pixels, e.g., the pixels in the 3×3 kernels 502A, 502B, 502C, and 502D (sometimes collectively referred to as neighboring pixels 502) (illustrated with shading in FIG. 5) centered on the pixels of interest 504.

The predicted signals may be separately determined using neighboring pixels 502 from one or more of the detector arrays 458. For example, a first predicted signal may be determined using only neighboring pixels 502A in detector array 458A, a second predicted signal may be determined using only neighboring pixels 502B in detector array 458B, a third predicted signal may be determined using only neighboring pixels 502C in detector array 458C, and a fourth predicted signal may be determined using only neighboring pixels 502D in detector array 458D. The first predicted signal may be compared to the pixel of interest 504A in detector array 458A, the second predicted signal may be compared to the pixel of interest 504B in detector array 458B, the third predicted signal may be compared to the pixel of interest 504C in detector array 458C, and the fourth predicted signal may be compared to the pixel of interest 504D in detector array 458D. If desired, fewer predicted signals may be determined and compared to the corresponding pixel of interest, e.g., for a sub-set of the detector arrays.

Additionally, or alternatively, a predicted signal for one or more pixels of interest may be determined using corresponding neighboring pixels from a plurality of detector arrays 458. For example, a predicted signal for pixel of interest 504A may be determined using corresponding neighboring pixels 502A, 502B, 502C, and 502D together and then compared to the signal from the pixel of interest 504A. Similarly, a predicted signal for each pixel of interest 504B, 504C, and 504D may be determined using corresponding neighboring pixels 502A, 502B, 502C, and 502D together and then compared to the signals from each of the pixels of interest 504B, 504C, and 504D. If desired, the signals from one or more of the pixels of interest 504 may be combined, and a predicted signal for the combined pixels of interest may be determined using neighboring pixels from a plurality of detector arrays 458. For example, the signals from pixels of interest 504A and 504B may be combined and a predicted signal may be determined using corresponding neighboring pixels 502A and 502B and compared to the combined signal from the pixels of interest 504A and 504B. If desired, the signals from subsets of pixels may be combined and compared. For example, the signals (e.g., the intensity of the signals without fringes) from pixels 504A and 504C may be combined, e.g., as sum, average, mean, etc., and compared to the same combination of the signals from pixels 504B and 504C (or different neighboring or additional neighboring pixels if desired). Given that the underlying pattern on the sample is constant, the combination (e.g., sum, mean, average, etc.) of the signals from the pixel of interest 504A with a neighboring pixel (504C) should be the same as the combination of signals from neighboring pixels (504B and 504D). A difference between these combinations of signals, e.g., from pixels 504A/504C and pixels 504B/504D or other neighboring pixels, may indicate a defect. Additionally, comparisons may be performed using pixels that are believed to be defect free to provide an indication of how much of a difference between combinations of signals may arise from chance, which may be used to set a threshold to determine if any differences are significant and may indicate the presence of a defect.

As discussed above, an abnormal signal may be considered to indicate the presence of a defect at the pixel of interest, e.g., if the abnormal signal is greater than a threshold. A die-to-die comparison may be performed to confirm the presence of a defect, e.g., by determining whether a defect (or abnormal signal) is likewise found at a location on a different die that corresponds to the location associated with the pixel of interest, which may indicate that the abnormal signal is caused by an intended structure design and not a defect. In some implantations, the abnormal signal (even if present in a die-to-die comparison) may identify a systematic defect, which may be verified using a review station, such as a Scanning Electron Microscope (SEM) or Atomic Force Microscope (AFM). Defect detection may be performed for the entire area of interest on the sample by treating each of the pixels in the detector arrays 458 as pixels of interest with an associated array of neighboring pixels.

Figure 6:
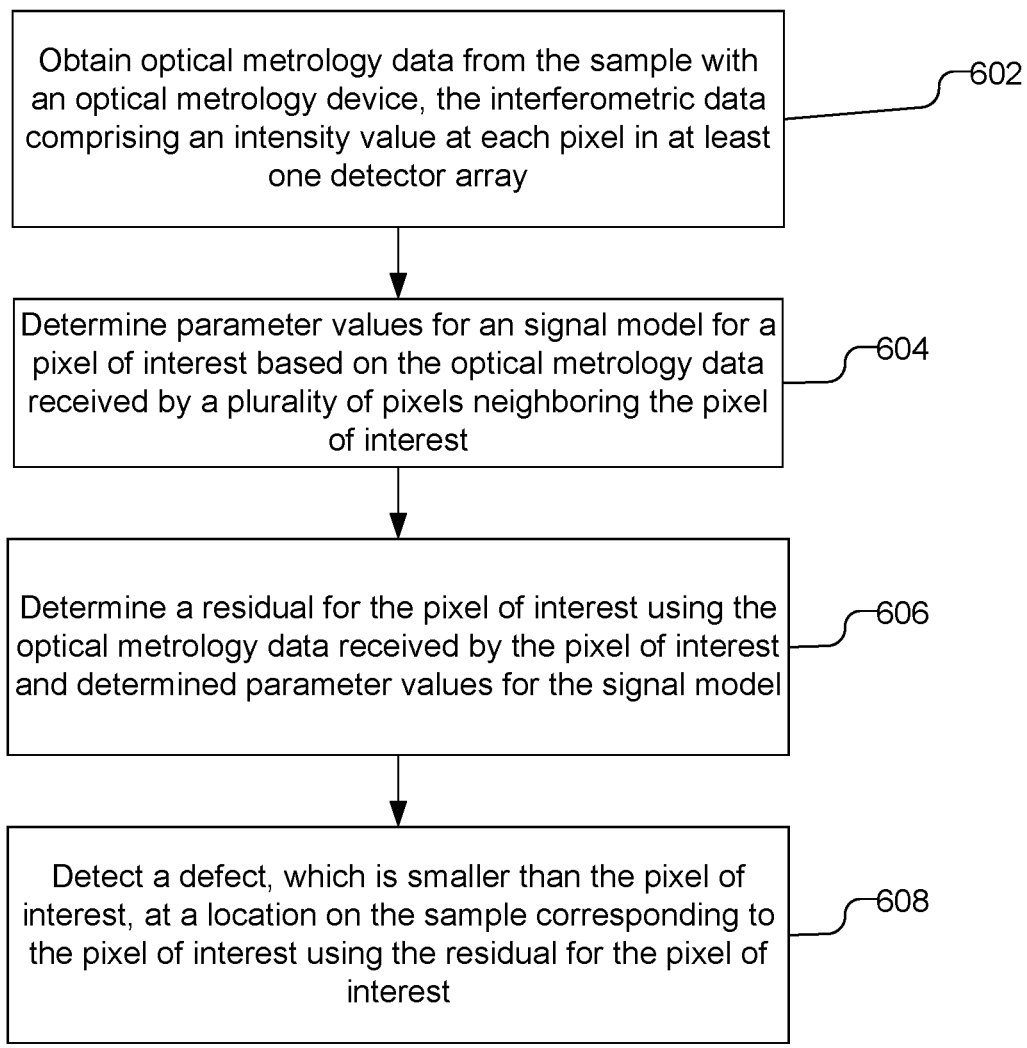
FIG. 6 illustrates a flow chart of a method of detecting a sub-resolution defect on a sample with an interferometer.

FIG. 6, by way of example, is a flow chart illustrating a method of detecting a sub-resolution defect on a sample with an optical metrology device, such as an interferometer. As illustrated, optical metrology data is obtained from the sample with an optical metrology device (602), where the optical metrology data may be an intensity value at each pixel in at least one detector array. By way of example, the optical metrology device may be a phase shifting interferometer, such as interferometer 100 or 400 discussed above, or may be another type of interferometer or optical metrology device, such as a reflectometer or ellipsometer. The optical metrology data may be interferometric data produced by interference between the test beam reflected by the sample and the reference beam reflected by a reference mirror after passing through a micropolarizer pixel that is aligned with a pixel of the detector array. If desired, however, other types of interferometers may be used for example one that uses multiple detectors each with a different phase shift.

Parameter values are determined for a signal model, such as an interference signal model, for a pixel of interest based on the optical metrology data received by a plurality of pixels neighboring the pixel of interest (604). For example, the pixel of interest may be the pixel 304 or 504 shown in FIGS. 3A, 3B, and 5 and the plurality of pixels neighboring the pixel of interest may be the shaded pixels in the 2×2 kernel, the 3×3 kernel, or the 5×5 kernel shown in FIGS. 3A, 3B, 5, and 7 (discussed below). If desired, larger kernels or smaller kernels (e.g., a three pixel kernel) may be used. The plurality of pixels neighboring the pixel of interest may be pixels that correspond to areas on the sample with a same reflectance and relative surface height as an area on the sample corresponding to the pixel of interest, e.g., pixels that nominally produce the same signal as the pixel of interest other than the effect of the known phase shift. The signal model for the pixel of interest may be based on the signal $S_i$ of equation 1 and the parameter values to be determined may be, e.g., the phase value (kz) and magnitude (a,b), although other equations and other parameter values may be used if desired and as appropriate. The parameter values for the signal model for the pixel of interest 304 may be determined, e.g., based on a best fit for the optical metrology data received by the array of pixels neighboring the pixel of interest. For example, the interferometric data received at each shaded pixel in the kernel, e.g., shown in FIGS. 3A, 3B, 5, and 7, and the signal $S_i$ from equation 1 may be used to find simultaneously a best fit for the parameter values, e.g., phase value (kz) and magnitude (a,b). Alternatively, a best fit for the parameter values, e.g., phase value (kz) and magnitude (a,b), may be found separately for each shaded pixel in the kernel, e.g., shown in FIGS. 3A, 3B, 5, and 7, and the resulting parameter values may be used to find the central or typical value of the distribution, e.g., by finding the average, mean, median, mode, or other statistically relevant values. Additionally, the signal model for the pixel of interest may be generated as a best fit to a polynomial to account for any non-planarity, e.g., curvature, of the sample.

Referring to FIG. 6, the residual for the pixel of interest is determined using the optical metrology data received by the pixel of interest and determined parameter values for the signal model (606). The residual analysis for the pixel of interest, for example, may be used to determine how much variation is present in the signal received by the pixel of interest, which may be used to determine whether a possible defect is present on the sample at a location that is imaged by pixel of interest. The residual may be determined by comparing the optical metrology data received by the pixel of interest to predicted optical metrology data for the pixel of interest determined using the determined parameter values with the signal model for the pixel of interest. By way of example, the residual for the pixel of interest may be determined by:

$$\text{Residual} = S_{poi} - a_{fit} \cdot \cos\left(kz_{fit} + \frac{i_{poi}\pi}{2}\right) - b_{fit} \qquad \text{eq. 8}$$

where $S_{poi}$ is received interferometric data at the pixel of interest, $i_{poi}$ is the reference number for the pixel of interest (as illustrated in FIGS. 3A and 3B), and $a_{fit}$, $b_{fit}$, and $kz_{fit}$ are the parameter values determined from the neighboring pixels in the kernel.

A defect smaller than the pixel of interest may be detected at a location on the sample corresponding to the pixel of interest using the residual for the pixel of interest (608). For example, if the residual for the pixel of interest 304 is large, then a defect may be present on the sample at a location that corresponds to the pixel of interest. The defect may be detected for example, by determining that the residual is greater than a predetermined threshold. The threshold may be predetermined empirically or through modeling, and may depend on specific parameters of the interferometer 100. For example, it may be desirable to alter the threshold if the sample is determined to be non-planar, e.g., based on the polynomial fit from the neighboring pixels to generate the signal model for the pixel of interest. Setting a detection threshold experimentally is well within the abilities of those skilled in the art in light of the present disclosure. Lower thresholds increase the fraction of small defects that are detected, but also cause the detection of defects that are not real, known as false defects. Detection of false defects occurs when the residual signal exceeds the threshold by random chance, and so the false detection rate depends on the threshold setting and the random noise in the residual for the pixel of interest. The random noise in the residual calculated, e.g., from equation 8, will be increased above the noise in the surface reading at the pixel under test by the noise in the fit term calculated using the fit parameters $a_{fit}$, $b_{fit}$, and $kz_{fit}$, and this must be taken into account when determining the optimum detection threshold.

Clusters of defects may be examined to identify patterns with specific shapes, where the specific shapes may be used to classify defects into pre-determined classes. A dishing defect, an area with a smoothly varying surface, is an additional class of defect that cannot be detected by conventional inspection tools. Detailed simulation of the semiconductor fabrication process can be used to determine areas prone to dishing effects, as can analysis of empirical data from multiple wafers. This knowledge can be used to enable a search for areas of small, systematic variations in surface height with a known shape. One example of a dished surface will be a described by a two-dimensional quadratic function (equation 9).

$$z(x,y) = c_0 + c_1 x + c_2 y + c_3 x^2 + c_4 xy + c_5 y^2 \qquad \text{eq. 9}$$

It might be advantageous to trigger a search for curved surface areas only after first detecting more than a predetermined number of isolated defects, thereby reducing the time taken to perform the analysis. A test, such as a $\chi^2$ test, of the residual differences between measured and fitted $z(x,y)$ will be necessary to decide whether the fit is appropriate, and so whether an area is really curved. A dish defect is detected if the maximum amplitude of the fitted function exceeds a detection threshold. The uncertainty in the fit of a two-dimensional quadratic surface (equation 9, which has six fitted parameters $c_0$ to $c_5$) to an area of N pixels will be reduced by a factor of approximately $1/\sqrt{(N-6)}$ with respect to that of a fit from only three neighbors using equation 1, and so the detection threshold for dished defects can be smaller than the threshold used when detecting single defects.

Additionally, the process of defect detection may include comparing the inspection result for the pixel of interest, e.g., the residual from step 606 or the presence of a possible defect from step 608, the inspection result from at least one other location on the sample that corresponds to the location associated with the pixel of interest, e.g., a die-to-die comparison. If the other location on the sample has a similar inspection result, e.g., a residual value from step 606 that is within a predetermined threshold of the residual for the pixel of interest or the presence of a possible defect from step 608, then the possible defect at the pixel of interest may be an intended structure design and not a defect. On the other hand, if the other location on the sample does not have a similar inspection result, then the possible defect at the pixel of interest may be considered a defect. Comparing each pixel with data from at least two other locations allows identification of which of the three locations is defective, if any. Defect detection by comparison to other locations is described further in the U.S. patent application Ser. No. 16/197,849, entitled "Sample Inspection Using Topography," filed Nov. 21, 2018, which is herein incorporated by reference in its entirety.

When a defect at the pixel of interest is detected, the presence of the defect may be associated with the corresponding location on the sample and stored in memory of the 174 of the computer 170. If desired, the sample may be further inspected to identify the type of defect and appropriate action taken to remedy the defect or to excise the defective die from the lot and/or to prevent similar defects from occurring in future fabrication. Defect data, including the presence of the defect at the pixel of interest on the sample, may be communicated to adjust one or more process or metrology tools associated with a fabrication process step in the fabrication sequence or to alter a future fabrication sequence of the sample. For example, the defect data may be used to adjust the operation of a metrology tool, e.g., by avoiding the use of a target that includes a defect or considering the defect during analysis of the defect, e.g., by correcting a model of the target to include the defect. Additionally, the defect data may be used to adjust a process tool that is responsible for the detected defect by adjusting one or more process parameters or removing the process tool from the production line to prevent the process tool from producing defects in later processed samples. Additionally, the defect data may be used to adjust the fabrication sequence of the sample itself, e.g., by rejecting or discarding the sample or a portion of the sample, e.g., the entire wafer or a die from the wafer. Thus, the detection of a defect may be used to modify, alter, or inform further processing of the test sample or processing of other samples.

It should be understood that defects may be present in the pixels neighboring the pixel of interest, e.g., in the kernel 302, 302', or 502, which are used to determine the parameter values of the signal model. The presence of a defect in one or more of the pixels neighboring the pixel of interest may result in a skewing of the parameter values, which may result in an erroneous indication of a defect at the pixel of interest. Accordingly, prior to determining the residual in the pixel of interest (step 606), it may be desirable to verify that the residual for each pixel in the neighboring pixels is within an acceptable tolerance. Any outlier pixels may be discarded and the parameter values for the signal model for the pixel of interest may be re-determined prior to determining the residual of the pixel of interest. Alternatively, prior to determining the parameter values of the signal model, the optical metrology data received at the neighboring pixels may be compared to the optical metrology data received by pixels having the same reference number i (as illustrated in FIGS. 3A, 3B, and 5), and any outliers, identified by a predetermined threshold, may be discarded prior to determining the residual of the pixel of interest.

Figure 7:
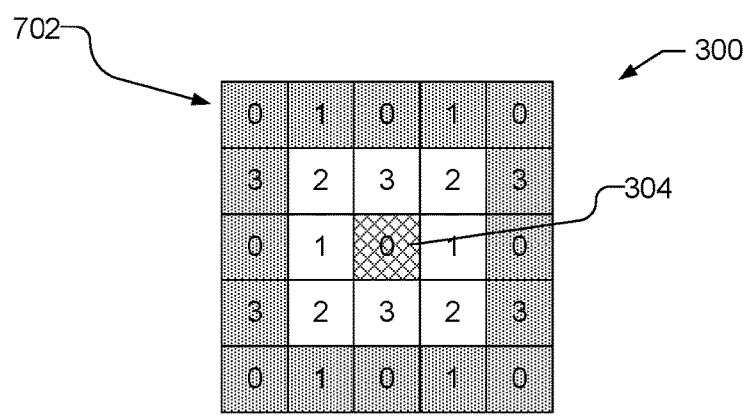
FIG. 7 illustrates a plan view of a portion of the micropolarizer array and the detector array in the interferometer, similar to that shown in FIGS. 3A and 3B, and illustrates a 5×5 kernel for detecting a defect at a pixel of interest.

Moreover, instead of the shaded pixels shown in the kernels 302, 302' or 520 in FIG. 3A, 3B or 5, fewer, additional, or other pixels around the pixel of interest may be used to determine the parameter values of the signal model. For example, as illustrated in FIGS. 3A and 3B, the pixels of interest 304 and 304 are not included in the plurality of pixels that are used to determine the parameter values. However, if desired, the pixel of interest 304 may be included in the kernel that are used determine the parameter values (i.e., the pixel of interest is treated as a neighboring pixel), but doing so will skew the resulting parameter values thereby making detection of a defect at the pixel of interest more difficult. Moreover, additional or fewer pixels neighboring the pixel of interest may be used. Further, the pixels neighboring the pixel of interest used to determine the parameter values may be immediately adjacent to the pixel of interest, e.g., as illustrated in FIGS. 3A, 3B, and 5, or may not be immediately adjacent to the pixel of interest, e.g., as illustrated in FIG. 7, discussed below. Further, the pixels neighboring the pixel of interest used to determine the parameter values may not be contiguous with each other and may or may not completely surround the pixel of interest.

For example, for the kernel 302 shown in FIG. 3A, if the pixel of interest is at an edge or corner of the detector array, the neighboring pixels would not completely surround the pixel of interest. Moreover, as discussed above, one or more of the neighboring pixels may be discarded as an outlier and not used to determine the parameter values. In another example of non-contiguous pixels, only pixels having the same reference number i as the pixel of interest in FIGS. 3A and 3B may be used to determine the parameter values for the interferometric signal model.

It is possible that a defect, even a sub-resolution defect, may overlap pixel boundaries, which will cause the signals at two or more pixels to be abnormal. Accordingly, it may be useful to separate the pixel of interest from the neighboring pixels that are used to determine the parameter values for the signal model. For example, FIG. 7 illustrates the detector array 300 illustrated in FIGS. 3A and 3B, but illustrates a 5×5 kernel 702 centered on the pixel of interest 304 that may be used to determine the parameter values for the signal model for the pixel of interest 304. As indicated by the shading of the pixels in the 5×5 kernel 702 and the non-shading of the center 3×3 area of the kernel, the center 3×3 pixels in the 5×5 kernel may be excluded from the determination of the parameter values for the signal model, i.e., so that the neighboring pixels used to determine the parameter values are not immediately adjacent to the pixel of interest. By using pixels that are not immediately adjacent to the pixel of interest, as illustrated in FIG. 7, if a defect overlaps the boundary of the pixel of interest 304, the defect will not affect the parameter values for the signal model determined by the neighboring pixels 702.

This method assumes that defects are sparse and that there is a relatively large area of on the sample with a constant pattern. For example, if a 10× objective is used, then the pixel size is typically 0.75 μm, so the area of a 5×5 kernel is 3.75×3.75 μm. Additionally, the optical resolution may be smaller than the single pixel size, e.g., 0.75 μm or less, rather than double that for a surface measurement. One defect in a 4×4 μm area is 62500 mm$^{-2}$, which is considered dense. Accordingly, the assumption of at most one defect in the 4×4 μm area is valid.

By processing the interferometer data, as discussed above, as opposed to computing a surface height of the sample, as performed with conventional interferometers, sub-resolution defects on the sample may be detected with a high degree of sensitivity. For example, for a circular defect of diameter d, the fractional area, F, of the defect in a pixel of size P×P is $$F = \pi \left(\frac{d}{2P}\right)^2 \qquad \text{eq. 10}$$

To be detectable, the signal change due to the defect should exceed the noise floor. Assuming the noise in the signal is equivalent to a Z uncertainty of δ, if the defect is of a height H, then $$H > \frac{\delta}{\pi}\left(\frac{2P}{d}\right)^2; \qquad \text{eq. 11}$$

$$d > 2P\sqrt{\frac{\delta}{\pi H}}. \qquad \text{eq. 12}$$

Figure 8:
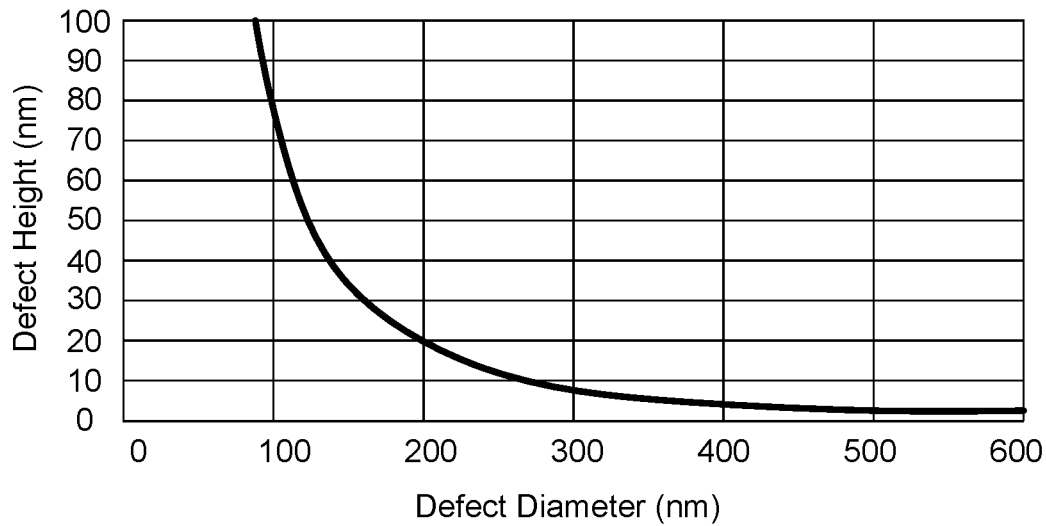
FIG. 8 is a graph illustrating a minimum detectable defect height with respect to defect diameter.

FIG. 8 is a graph illustrating a minimum detectable defect height with respect to defect diameter, where δ≈1 nm and P=750 nm. Thus, as can be seen, if a defect has a height greater than 5 nm, then it is detectable if it is larger than 400 nm in diameter. With noise reduced to 0.1 nm, it is reasonable to expect to detect defects that are as small as 100 nm in diameter. Both results are smaller than the instrument resolution of 750 nm, and so detection of defects smaller than the resolution limit ("sub-resolution" detection) is possible if the signal noise is low enough.

Noise reduction may be accomplished, e.g., by combining multiple images in the defect detection. For example, the interferometric data obtained in step 602 in FIG. 6, may be obtained over multiple optical path differences, e.g., by moving the reference objective 136. The parameter values determined in step 604 and the residual at step 606 may be determined using the interferometric data obtained over multiple optical path differences. Changing the optical path difference between acquisitions modifies the origin, $z_0$, for the z parameter in equation 1. It is necessary to correct the surface data for these shifts either by subtracting the known z axis movement, or by subtracting the average z value from all data. By combining multiple images the noise in the determined parameter values for the signal model of the pixel of interest is reduced.

Figure 9:
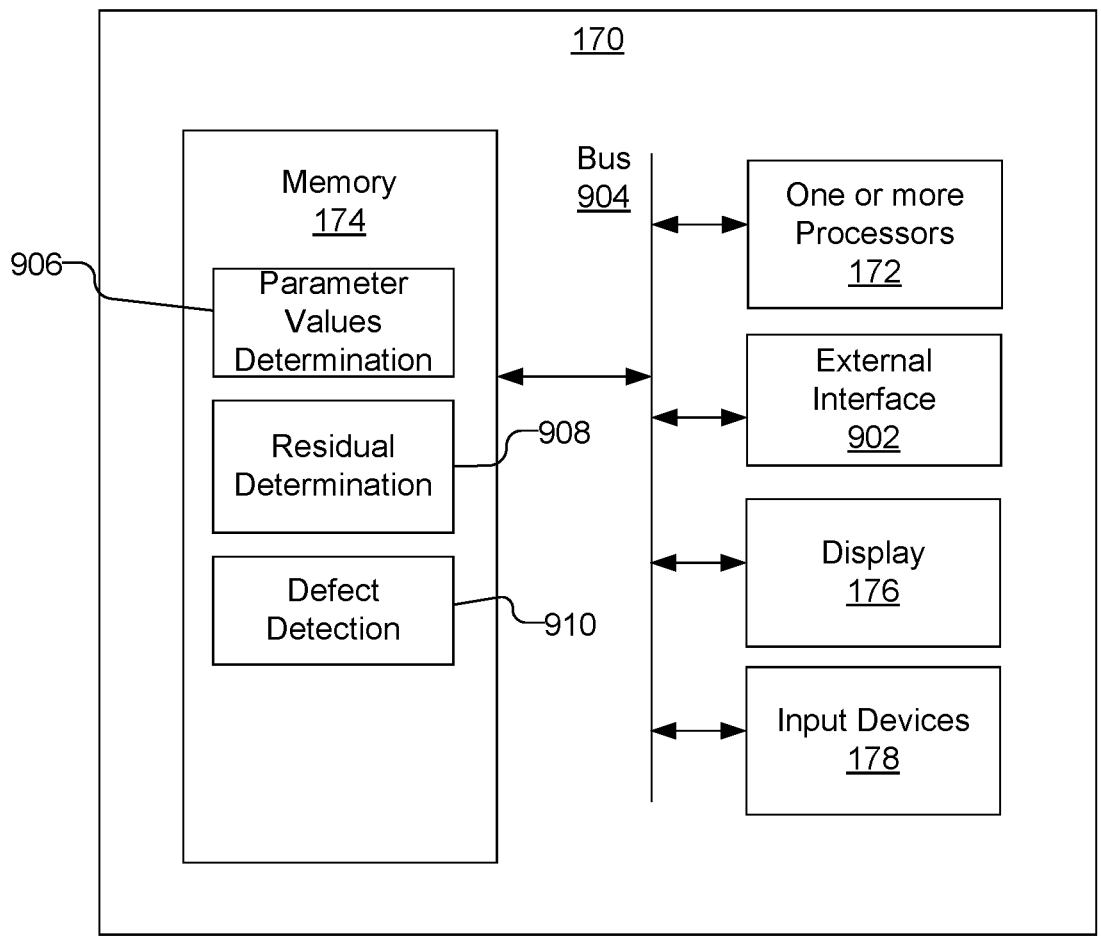
FIG. 9 is a diagram illustrating an example of a hardware implementation of a computer, which may be used with interferometer to detect sub-resolution defects.

FIG. 9 is a diagram illustrating an example of a hardware implementation of a computer 170, which may be used with interferometers 100, 400 shown in FIGS. 1 and 4. The computer 170 includes, e.g., hardware components such as an external interface 902, which may be a wired or wireless interface capable of connecting to receive data from the camera 150 and to provide control signals to the stage 144 of the interferometer 100 and to export defect data. The computer 170 further includes a user interface including e.g., the display 176 and input devices 178. The computer 170 further includes one or more processors 172 and memory 174, which may be coupled together with bus 904. The one or more processors 172 and other components of the computer 170 may similarly be coupled together with bus 904, a separate bus, or may be directly connected together or a combination of the foregoing.

The memory 174 may contain executable code or software instructions that when executed by the one or more processors 172 cause the one or more processors to operate as a special purpose computer programmed to perform the algorithms disclosed herein. For example, as illustrated in FIG. 9, the memory 174 includes one or more components or modules that when implemented by the one or more processors 172 implements the methodologies as described herein. While the components or modules are illustrated as software in memory 174 that is executable by the one or more processors 172, it should be understood that the components or modules may be dedicated hardware either in the processor or off processor.

As illustrated, the memory 174 may include a parameter values determination unit 906 that when implemented by the one or more processors 172 causes the one or more processors 172 to determine the parameter values for a signal model for the pixel of interest. As discussed above, the parameter values determination unit 906 may use optical metrology data received by the plurality of pixels that neighbor the pixel of interest to determine the parameter values. For example, the parameter values determination unit 906 may cause the one or more processors 172 to find a best fit for the parameter values for the signal model using the optical metrology data received at each pixel in the plurality of pixels neighboring the pixel of interest, as discussed above.

The memory 174 may include a residual determination unit 908 that when implemented by the one or more processors 172 causes the one or more processors 172 to determine a residual for the pixel of interest using the optical metrology data received by the pixel of interest and determined parameter values for the signal model for the pixel of interest, as discussed above. For example, the residual determination unit 908 may cause the one or more processors 172 to compare the interferometric data received by the pixel of interest to predicted optical metrology data for the pixel of interest determined using the determined parameter values and the interference signal model for the pixel of interest, as discussed above.

The memory 174 may include a defect detection unit 910 that when implemented by the one or more processors 172 causes the one or more processors 172 to detect a defect, which is smaller than the pixel of interest, at a location on the sample imaged at the pixel of interest based on the residual for the pixel of interest, as discussed above. For example, the defect detection unit 910 may cause the one or more processors 172 to determine whether the residual is greater than a predetermined threshold, as discussed above.

The methodologies described herein may be implemented by various means depending upon the application. For example, these methodologies may be implemented in hardware, firmware, software, or any combination thereof. For a hardware implementation, the one or more processors may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For an implementation involving firmware and/or software, the methodologies may be implemented with modules (e.g., procedures, functions, and so on) that perform the separate functions described herein. Any machine-readable medium tangibly embodying instructions may be used in implementing the methodologies described herein. For example, software codes may be stored in a memory and executed by one or more processor units, causing the processor units to operate as a special purpose computer programmed to perform the algorithms disclosed herein. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a non-transitory computer-readable storage medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage, semiconductor storage, or other storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable storage medium, instructions and/or data may be provided as signals on transmission media included in a communication apparatus. For example, a communication apparatus may include a transceiver having signals indicative of instructions and data. The instructions and data are stored on non-transitory computer readable media, e.g., memory 174, and are configured to cause the one or more processors to operate as a special purpose computer programmed to perform the algorithms disclosed herein. That is, the communication apparatus includes transmission media with signals indicative of information to perform disclosed functions.

In one implementation, an apparatus, such as computer 170, illustrated in FIG. 9, may be configured to detect a sub-resolution defect. The apparatus may include means for obtaining optical metrology data from the sample with the interferometer, the interferometric data comprising an intensity value at each pixel in at least one detector array, which may be, e.g., the external interface 902 that is coupled to receive data from the camera 150 in the interferometer 100 or cameras 150A, 150B, 150C, and 150D in the interferometer 400. A means for determining parameter values for a signal model for a pixel of interest in the at least one detector array based on the optical metrology data received by a plurality of pixels neighboring the pixel of interest may be, e.g., the parameter values determination unit 906 in memory 174 that is implemented by the one or more processors 172. A means for determining a residual for the pixel of interest using the optical metrology data received by the pixel of interest and determined parameter values for the signal model for the pixel of interest may be, e.g., the residual determination unit 908 in memory 174 that is implemented by the one or more processors 172. A means for detecting a defect, which is smaller than the pixel of interest, at a location on the sample imaged at the pixel of interest based on the residual for the pixel of interest may be, e.g., the defect detection unit 910 in memory 174 that is implemented by the one or more processors 172. A means for communicating defect data including a presence of the defect in the pixel of interest to adjust one or more process tools associated with a fabrication process step in the fabrication sequence or to alter a future fabrication sequence of the sample may be, e.g., the external interface 902.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method of detecting a sub-resolution defect on a sample, the method comprising:

obtaining optical metrology data from the sample, the optical metrology data comprising an intensity value at each pixel in at least one detector array;

determining parameter values for a signal model for a pixel of interest in the at least one detector array based on the optical metrology data received by a plurality of pixels neighboring the pixel of interest;

determining predicted optical metrology data for the pixel of interest using the determined parameter values for the signal model for the pixel of interest;

determining a residual for the pixel of interest using the optical metrology data received by the pixel of interest and the predicted optical metrology data; and detecting a defect, which is smaller than the pixel of interest, at a location on the sample corresponding to the pixel of interest using the residual for the pixel of interest.

2. The method of claim 1, communicating defect data including a presence of the defect in the pixel of interest to adjust one or more process tools associated with a fabrication process step in a fabrication sequence or to alter a future fabrication sequence of the sample.

3. The method of claim 1, wherein the at least one detector array comprises a single detector array with a micropolarizer array comprising micropolarizer pixels aligned with the pixels of the single detector array, wherein the micropolarizer array comprises a repeated array of micropolarizer pixels having discrete polarizations.

4. The method of claim 1, wherein the at least one detector array comprises a single detector array with a phase mask comprising phase delay elements aligned with the pixels of the single detector array, wherein the phase mask comprises a repeated array of phase delay elements having discrete phase delays.

5. The method of claim 1, wherein the at least one detector array comprises a plurality of detector arrays, wherein corresponding pixels in the plurality of detector arrays receive optical metrology data from a same location on the sample, and wherein the pixel of interest in the at least one detector array comprises one pixel in at least one detector array, wherein separate polarizers having discrete polarizations are positioned before each of the detector arrays.

6. The method of claim 1, wherein the at least one detector array comprises a plurality of detector arrays, wherein corresponding pixels in the plurality of detector arrays receive optical metrology data from a same location on the sample, and wherein the pixel of interest in the at least one detector array comprises one pixel in at least one detector array, wherein separate phase delay elements having discrete phase delays are positioned before each of the detector arrays.

7. The method of claim 1, wherein the intensity value at each pixel in the at least one detector array is a function of at least one of reflectivity and phase.

8. The method of claim 1, wherein the optical metrology data is interferometric data acquired with an interferometer and the signal model for the pixel of interest is an interference signal model for the pixel of interest.

9. The method of claim 8, wherein the interferometer is a phase shifting interferometer and the interferometric data received by each pixel in the at least one detector array comprises the intensity value at the pixel produced by interference between a test beam reflected by the sample and a reference beam reflected by a reference mirror after passing through a polarizer.

10. The method of claim 1, wherein the pixel of interest is not included in the plurality of pixels when determining the parameter values for the signal model.

11. The method of claim 1, wherein the plurality of pixels neighboring the pixel of interest comprises pixels that are immediately adjacent to the pixel of interest.

12. The method of claim 1, wherein the plurality of pixels neighboring the pixel of interest comprises pixels that are not immediately adjacent to the pixel of interest.

13. The method of claim 1, wherein the plurality of pixels neighboring the pixel of interest comprises pixels that are not contiguous with each other.

14. The method of claim 1, wherein the plurality of pixels neighboring the pixel of interest are pixels that correspond to areas on the sample with a same reflectance and relative surface height as an area on the sample corresponding to the pixel of interest.

15. The method of claim 1, wherein determining the parameter values for the signal model for the pixel of interest based on the optical metrology data received by the plurality of pixels neighboring the pixel of interest comprises finding a best fit for the parameter values for the signal model using the optical metrology data received at each pixel in the plurality of pixels neighboring the pixel of interest.

16. The method of claim 1, wherein the determined parameter values for the signal model comprise a magnitude and a phase value.

17. The method of claim 1, wherein detecting the defect using the residual for the pixel of interest comprises determining the residual is greater than a predetermined threshold.

18. The method of claim 1, wherein the defect comprises a dishing defect, the method further comprising:
    detecting a cluster of defects for a plurality of pixels of interest on the sample;
    determining new parameter values for signal models for the plurality of pixels of interest by fitting for a curvature of the sample;
    determining new residuals for the plurality of pixels of interest using the optical metrology data received by each of the plurality of pixels of interest and the new parameter values for the signal models for each of the plurality of pixels of interest; and
    identifying the dishing defect using the new residuals.

19. The method of claim 1, wherein obtaining the optical metrology data from the sample comprises combining multiple images while obtaining the optical metrology data to reduce noise in the determined parameter values for the signal model of the pixel of interest.

20. An optical metrology apparatus configured to detect a sub-resolution defect, the optical metrology apparatus comprising:
    at least one detector array that receives light after it is incident on a sample and acquires optical metrology data from the light, wherein the optical metrology data comprises an intensity value at each pixel in the at least one detector array; and
    at least one processor coupled to the at least one detector array, the at least one processor obtains the optical metrology data, determines parameter values for a signal model for a pixel of interest in the at least one detector array based on the optical metrology data received by a plurality of pixels neighboring the pixel of interest, determines predicted optical metrology data for the pixel of interest using the determined parameter values for the signal model for the pixel of interest, determines a residual for the pixel of interest using the optical metrology data received by the pixel of interest and the predicted optical metrology data, and detects a defect, which is smaller than the pixel of interest, at a location on the sample corresponding to the pixel of interest using the residual for the pixel of interest.

21. The optical metrology apparatus of claim 20, wherein the at least one processor is further configured to communicate defect data including a presence of the defect in the pixel of interest to adjust one or more process tools associated with a fabrication process step in a fabrication sequence or to alter a future fabrication sequence of the sample.

22. The optical metrology apparatus of claim 20, wherein the at least one detector array comprises a single detector array with a micropolarizer array comprising micropolarizer pixels aligned with the pixels of the single detector array, wherein the micropolarizer array comprises a repeated array of micropolarizer pixels having discrete polarizations.

23. The optical metrology apparatus of claim 20, wherein the at least one detector array comprises a single detector array with a phase mask comprising phase delay elements aligned with the pixels of the single detector array, wherein the phase mask comprises a repeated array of phase delay elements having discrete phase delays.

24. The optical metrology apparatus of claim 20, wherein the at least one detector array comprises a plurality of detector arrays, wherein corresponding pixels in the plurality of detector arrays receive optical metrology data from a same location on the sample, and wherein the pixel of interest in the at least one detector array comprises one pixel in at least one detector array, wherein separate polarizers having discrete polarizations are positioned before each of the detector arrays.

25. The optical metrology apparatus of claim 20, wherein the at least one detector array comprises a plurality of detector arrays, wherein corresponding pixels in the plurality of detector arrays receive optical metrology data from a same location on the sample, and wherein the pixel of interest in the at least one detector array comprises one pixel in at least one detector array, wherein separate phase delay elements having discrete phase delays are positioned before each of the detector arrays.

26. The optical metrology apparatus of claim 20, wherein the intensity value at each pixel in the at least one detector array is a function of at least one of reflectivity and phase.

27. The optical metrology apparatus of claim 20, wherein the apparatus is an interferometer, and wherein the optical metrology data is interferometric data and the signal model for the pixel of interest is an interference signal model for the pixel of interest.

28. The optical metrology apparatus of claim 27, wherein the interferometer is a phase shifting interferometer and the interferometric data received by each pixel in the at least one detector array comprises the intensity value at the pixel produced by interference between a test beam reflected by the sample and a reference beam reflected by a reference mirror after passing through a polarizer.

29. The optical metrology apparatus of claim 20, wherein the pixel of interest is not included in the plurality of pixels when the at least one processor determines the parameter values for the signal model.

30. The optical metrology apparatus of claim 20, wherein the plurality of pixels neighboring the pixel of interest comprises pixels that are immediately adjacent to the pixel of interest.

31. The optical metrology apparatus of claim 20, wherein the plurality of pixels neighboring the pixel of interest comprises pixels that are not immediately adjacent to the pixel of interest.

32. The optical metrology apparatus of claim 20, wherein the plurality of pixels neighboring the pixel of interest comprises pixels that are not contiguous with each other.

33. The optical metrology apparatus of claim 20, wherein the plurality of pixels neighboring the pixel of interest are pixels that correspond to areas on the sample with a same reflectance and relative surface height as an area on the sample corresponding to the pixel of interest.

34. The optical metrology apparatus of claim 20, wherein the at least one processor is configured to determine the parameter values for the signal model for the pixel of interest based on the optical metrology data received by the plurality of pixels neighboring the pixel of interest by being configured to find a best fit for the parameter values for the signal model using the optical metrology data received at each pixel in the plurality of pixels neighboring the pixel of interest.

35. The optical metrology apparatus of claim 20, wherein the determined parameter values for the signal model comprise a magnitude and a phase value.

36. The optical metrology apparatus of claim 20, wherein the at least one processor is configured to detect the defect based on the residual for the pixel of interest by being configured to determine the residual is greater than a predetermined threshold.

37. The optical metrology apparatus of claim 20, wherein the defect comprises a dishing defect, wherein the at least one processor is configured to detect the dishing defect by being configured to detect a cluster of defects for a plurality of pixels of interest on the sample, determine new parameter values for signal models for the plurality of pixels of interest by fitting for a curvature of the sample, determine new residuals for the plurality of pixels of interest using the optical metrology data received by each of the plurality of pixels of interest and the new parameter values for the signal models for each of the plurality of pixels of interest, and identify the dishing defect using the new residuals.

38. The optical metrology apparatus of claim 20, wherein the at least one processor is configured to obtain the optical metrology data from the sample by being configured to combine multiple images while obtaining the optical metrology data to reduce noise in the determined parameter values for the signal model of the pixel of interest.

39. An apparatus configured to detect a sub-resolution defect, the apparatus comprising:
means for obtaining optical metrology data from a sample, the optical metrology data comprising an intensity value at each pixel in at least one detector array;
means for determining parameter values for a signal model for a pixel of interest in the at least one detector array based on the optical metrology data received by a plurality of pixels neighboring the pixel of interest;
means for determining predicted optical metrology data for the pixel of interest using the determined parameter values for the signal model for the pixel of interest;
means for determining a residual for the pixel of interest using the optical metrology data received by the pixel of interest and the predicted optical metrology data; and
means for detecting a defect, which is smaller than the pixel of interest, at a location on the sample corresponding to the pixel of interest using the residual for the pixel of interest.

40. The apparatus of claim 39, further comprising means for communicating defect data including a presence of the defect in the pixel of interest to adjust one or more process tools associated with a fabrication process step in a fabrication sequence or to alter a future fabrication sequence of the sample.

41. The apparatus of claim 39, wherein the pixel of interest is not included in the plurality of pixels when determining the parameter values for the signal model.

42. The apparatus of claim 39, wherein the plurality of pixels neighboring the pixel of interest comprises pixels that are immediately adjacent to the pixel of interest.

43. The apparatus of claim 39, wherein the plurality of pixels neighboring the pixel of interest comprises pixels that are not immediately adjacent to the pixel of interest.

44. The apparatus of claim 39, wherein the plurality of pixels neighboring the pixel of interest comprises pixels that are not contiguous with each other.

45. The apparatus of claim 39, wherein the plurality of pixels neighboring the pixel of interest are pixels that correspond to areas on the sample with a same reflectance and relative surface height as an area on the sample corresponding to the pixel of interest.

46. The apparatus of claim 39, wherein the means for determining the parameter values for the signal model for the pixel of interest based on the optical metrology data received by the plurality of pixels neighboring the pixel of interest finds a best fit for the parameter values for the signal model using the optical metrology data received at each pixel in the plurality of pixels neighboring the pixel of interest.

47. The apparatus of claim 39, wherein the determined parameter values for the signal model comprise a magnitude and a phase value.

48. The apparatus of claim 39, wherein the means for determining the residual for the pixel of interest using the optical metrology data received by the pixel of interest and the determined parameter values for the signal model compares the optical metrology data received by the pixel of interest to predicted optical metrology data for the pixel of interest determined using the determined parameter values and the signal model for the pixel of interest.

49. The apparatus of claim 39, wherein the means for detecting the defect based on the residual for the pixel of interest determines the residual is greater than a predetermined threshold.

50. The apparatus of claim 39, wherein the defect comprises a dishing defect, wherein the means for detecting the defect detects a cluster of defects for a plurality of pixels of interest on the sample, determines new parameter values for signal models for the plurality of pixels of interest by fitting for a curvature of the sample, determines new residuals for the plurality of pixels of interest using the optical metrology data received by each of the plurality of pixels of interest and the new parameter values for the signal models for each of the plurality of pixels of interest; and identifies the dishing defect using the new residuals.

51. The apparatus of claim 39, wherein the means for obtaining the optical metrology data from the sample combines multiple images while obtaining the optical metrology data to reduce noise in the determined parameter values for the signal model of the pixel of interest.

\* \* \* \* \*